United States Patent [19]
Keller et al.

[11] Patent Number: 5,457,059
[45] Date of Patent: Oct. 10, 1995

[54] METHOD FOR FORMING TIW FUSES IN HIGH PERFORMANCE BICMOS PROCESS

[75] Inventors: Stephen A. Keller, Sugarland; Rajiv R. Shah, Richardson, both of Tex.

[73] Assignee: Texas Instruments Incorporated, Dallas, Tex.

[21] Appl. No.: 234,894

[22] Filed: Apr. 28, 1994

[51] Int. Cl.$^6$ .................................................. H01L 23/62
[52] U.S. Cl. ............................. 437/34; 437/60; 437/192; 437/195; 437/922; 148/DIG. 55
[58] Field of Search .................... 437/34, 47, 59, 437/60, 922, 192, 195, 203; 148/DIG. 55

[56] References Cited

U.S. PATENT DOCUMENTS

| | | | |
|---|---|---|---|
| 4,209,894 | 7/1980 | Keen | 437/921 |
| 4,420,504 | 12/1983 | Cooper et al. | 437/921 |
| 4,792,835 | 12/1988 | Sacarisen et al. | 437/245 |
| 4,882,293 | 11/1989 | Naumann et al. | 437/922 |
| 4,962,062 | 10/1990 | Uchiyama et al. | 437/225 |
| 5,017,510 | 5/1991 | Welch et al. | 148/DIG. 55 |
| 5,065,208 | 11/1991 | Shah et al. | 357/34 |

Primary Examiner—Brian E. Hearn
Assistant Examiner—Tuan Nguyen
Attorney, Agent, or Firm—Paul C. Hashim; Wade James Brady; Richard L. Donaldson

[57] ABSTRACT

A method for providing programmable devices in which an insulation layer, such as an oxide (20), TEOS, or the like, is formed during a BiCMOS integrated circuit fabrication process includes forming a first conductor fuse layer (22), for example of TiW or the like, on the insulation layer (20). The fuse layer (22) may then be patterned, and a second insulation layer (23) formed over it. Alternatively, the fuse layer (53) may be left unpatterned and one or more conductor layers (35,36) may be formed over the fuse layer (53). The conductor layer (35,36) is patterned, and the fuse layer (53) thereafter patterned using the conductor layer (35,36) as an etch mask. In either case, contact holes (26) are formed in the insulation layer (20) to regions (14,15) to which contact is desired under the insulation layer (20). Contact conductors (28), such as of tungsten or the like, are formed in the contact holes (26) to contact the fuse (34), contact layers (22), or regions (14,15) under the insulation layer (20), as needed.

25 Claims, 6 Drawing Sheets

METHOD FOR FORMING TIW FUSES IN HIGH PERFORMANCE BICMOS PROCESS

BACKGROUND OF THE INVENTION

1. Field of the Invention

This invention relates to improvements in advanced BiCMOS processing methods and structures, and more particularly to improvements in methods for making programmable elements in advanced BiCMOS devices, and still more particularly to methods for making TiW fuses in a high performance BiCMOS process for field-programmable logic applications and to TiW fuses made thereby.

2. Relevant Background

Process techniques have been proposed for optimally merging advanced bipolar and advanced CMOS techniques to fabricate BiCMOS devices. Examples are shown in U.S. Pat. Nos. 4,962,053 and 5,065,208, assigned to the assignee hereof. However, these approaches in BiCMOS processing have been directed primarily towards non-programmable logic and SRAM applications. These applications do not require the formation of TiW fuses for programmation. The merger of bipolar and CMOS process flows for these applications is therefore the primary concern discussed in the two aforementioned patents.

For those circuits that require fuses for programming such as field programmable logic (FPL) circuits, there is a need to modify the process so that the fuses can be incorporated in the process with minimal changes to the basic process flow. The present invention discusses several methods for incorporating fuses, in general, and TiW fuses, in particular, with the minimal addition of processing to advanced BiCMOS processes proposed heretofore.

SUMMARY OF THE INVENTION

In light of the above, therefore, it is an object of the invention to provide a method and structure for providing programmable devices in BiCMOS applications.

It is another object of the invention to provide programmable devices in BiCMOS applications with little or minimal addition to the required BiCMOS processing steps.

It is yet another object of the invention to provide a method for incorporating TiW fuses into a BiCMOS process with minimal changes to the basic process flow.

These and other objects, features and advantages of the invention will be apparent to those skilled in the art from the following detailed description of the invention, when read in conjunction with the accompanying drawings and appended claims.

In accordance with a broad aspect of the invention, a method is presented for providing programmable devices in which an insulation layer, such as an oxide or the like, is formed during a BiCMOS integrated circuit fabrication process. In performing the method, a first conductor fuse layer, for example of TiW or the like, is formed on the insulation layer. A second conductor contact layer, such as AlCu or the like, is formed on the fuse layer. Contact holes are formed in the fuse, contact layer, and insulation layer to regions to which contact is desired under the insulation layer. Contact conductors, such as of tungsten or the like, are formed in the contact holes in electrical contact with the fuse, contact layers, and regions under the insulation layer. Portions of the contact layer are removed to leave contact leads in electrical contact with the fuse layer and at least some of the contact conductors, and portions of the fuse layer are removed to leave fuse material in regions between selected contact leads at which fuses are desired.

In one embodiment, a third conductor contact layer is formed on the second conductor contact layer before removing portions of the second conductor contact layer. In this embodiment, portions of the third conductor contact layer are removed in the same step as removing the second conductor contact layer. In subsequent steps, if desired, a photoresist mask used to define the pattern by which the lead layer is removed may be allowed to remain in place during subsequent processing steps.

In accordance with another broad aspect of the invention, a method is presented for forming a fuse in a BiCMOS integrated circuit fabrication process. In performing the method, an electrically conducting fuse layer, such as of TiW or the like, is formed and patterned on a first insulation layer, such as a TEOS layer or the like, over a partially completed integrated circuit structure. A second insulation layer, such as of an oxide or the like, is formed overall. Contact holes are formed in at least the second insulation layer to regions to which contact is desired under the second insulation layer, including at least one end of the fuse layer. Contact conductors, such as of tungsten or the like, are formed in the contact holes in electrical contact with the regions to which contact is desired, and contacts to the contact conductors are formed above the second insulation layer.

BRIEF DESCRIPTION OF THE DRAWINGS

The invention is illustrated in the accompanying drawings, in which.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

Figure 1A:
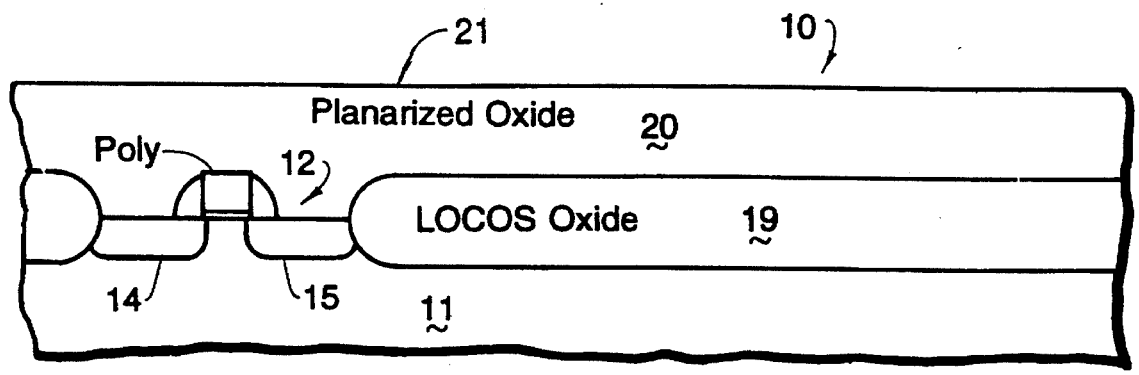
FIGS. 1(a) through 1(j) are a series of cross-sectional side views of an integrated circuit during various states of fabrication of a TiW fuse, in accordance with a preferred method according to the invention.
Figure 1B:
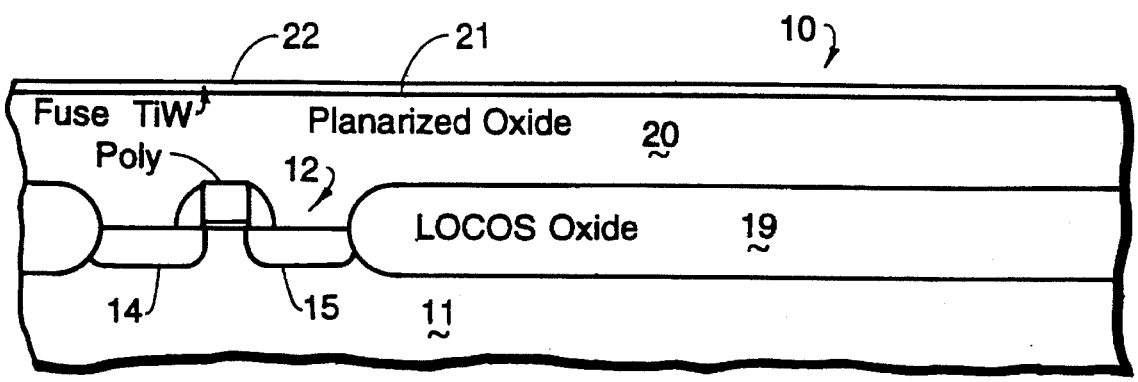
Figure 1C:
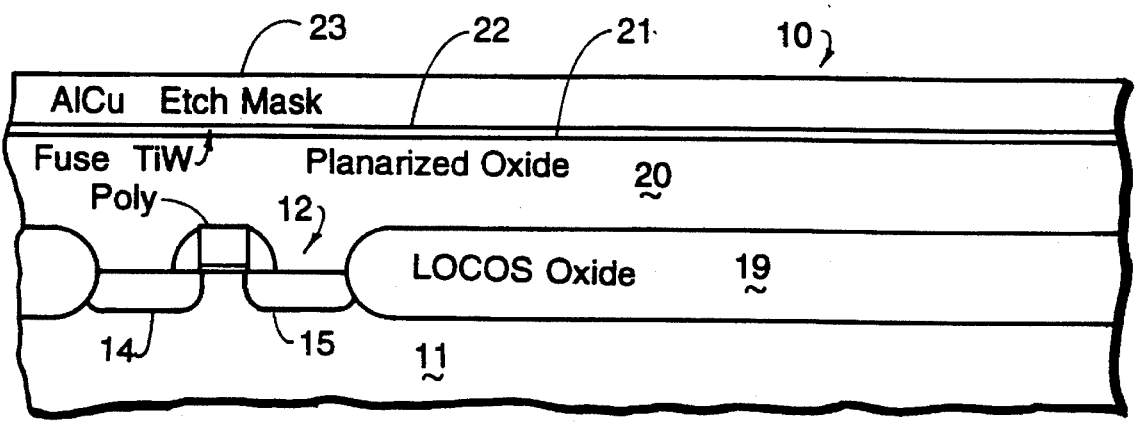

A cross sectional side view of a portion 10 of an integrated circuit at various stages during execution of a process flow in accordance with one embodiment of the invention is illustrated in FIGS. 1(a)–1(c). The integrated circuit portion 10 has been partially completed up to the point before the formation of the interconnects, fuse links, and normal subsequent structures for a first metal level interconnect. It will be understood that similar processing steps may be employed in subsequent metal level interconnect formations, if needed.

The integrated circuit portion 10 is formed on a semiconductor substrate 11, which may be doped or undoped silicon or other appropriate semiconducting material. The substrate 11 may include, in fact, appropriately doped isolated or tank regions used to enable the formation of CMOS and/or bipolar transistors of opposite conductivity type. The portion of the integrated circuit illustrated has one such MOS transistor 12 having doped source and drain regions 14 and 15 surrounded by a LOCOS oxide layer 19. A layer of oxide 20 that has been planarized by known techniques overlies the LOCOS oxide layer 19 and transistor 12. The structure shown in FIG. 1(a) represents a stage in a known integrated circuit process through premetal or interlevel planarization to present an overall planarized oxide layer 21.

As shown in FIG. 1(b), a layer 22 of TiW of approximately 500 Å is deposited on the oxide layer 20. The TiW fuse will ultimately be formed from the TiW layer 22, as below described. As shown in FIG. 1(c), a layer of AlCu 23 is deposited over at least the TiW fuse layer 22, preferably over the entire surface of the structure. The layer of AlCu 23 may be of thickness between about 2000 Å and 3000 Å.

Figure 1D:
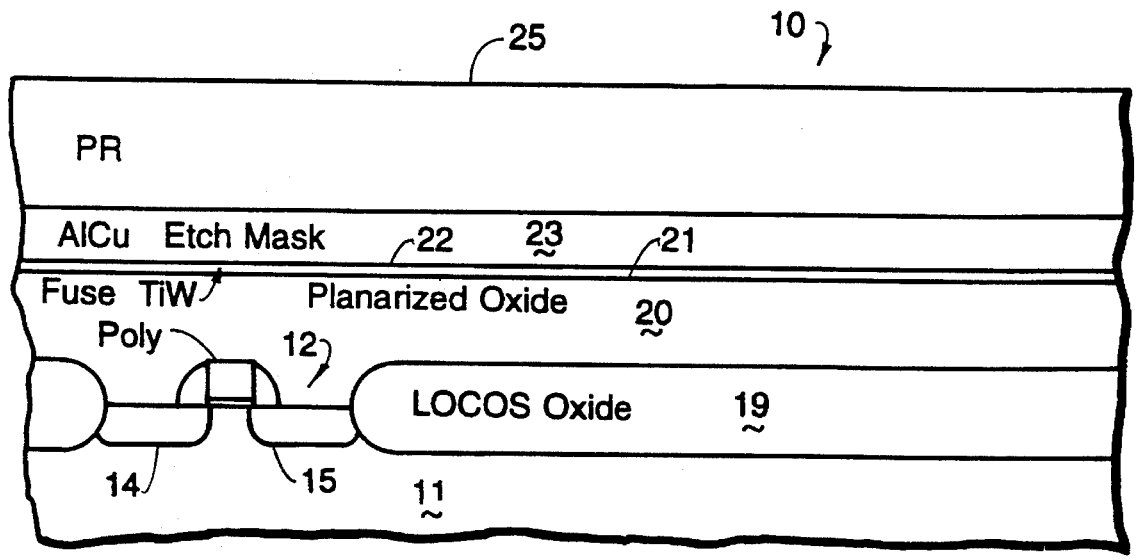
Figure 1E:
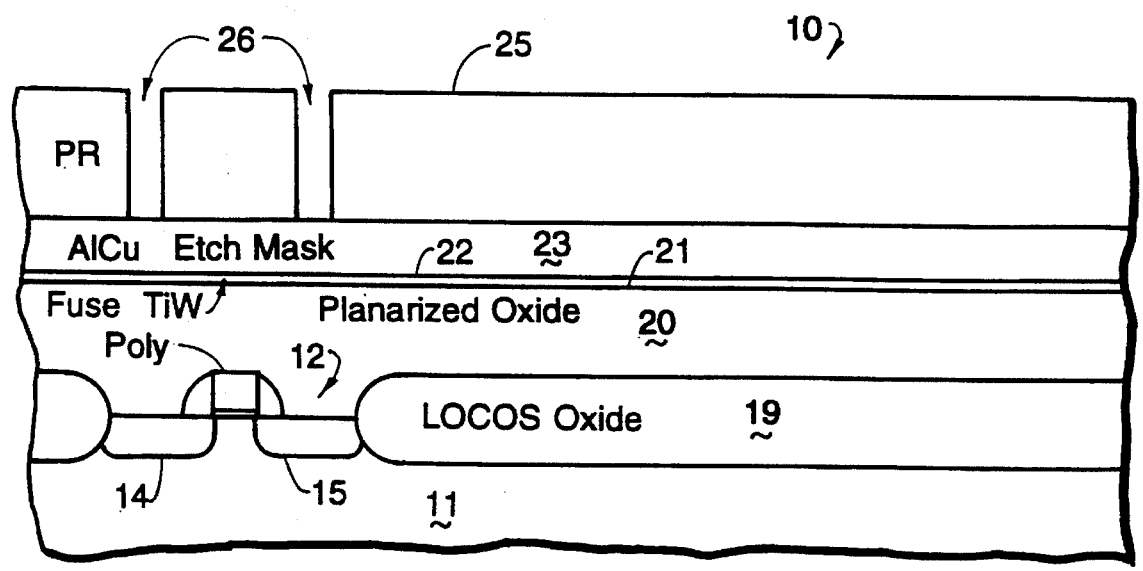
Figure 1F:
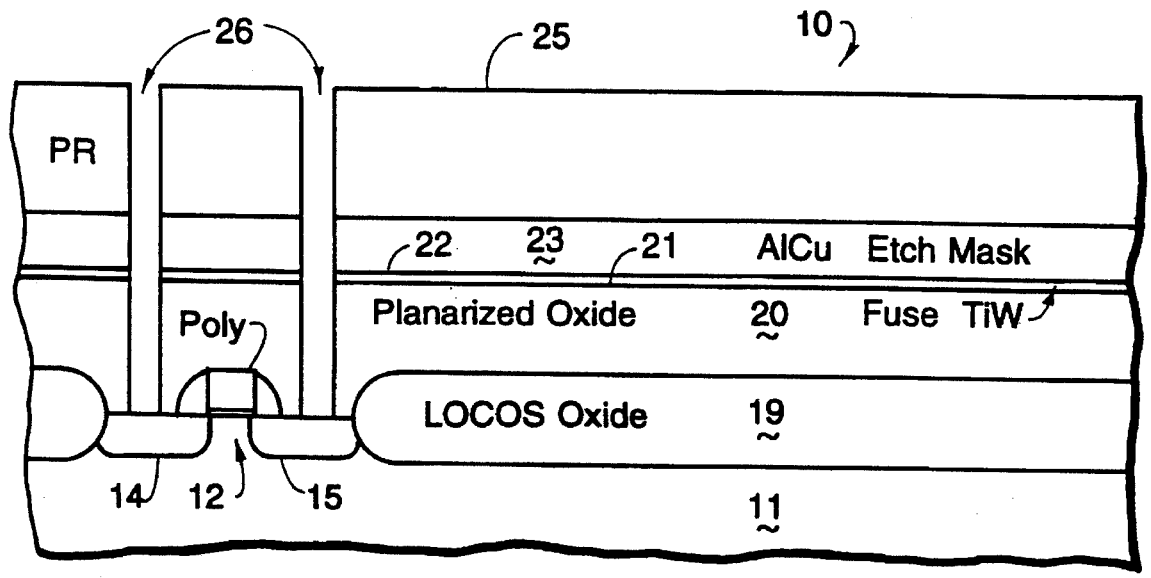

As shown in FIG. 1(d), a layer 25 of photoresist is deposited over the structure, and contact windows 26 are formed therein, as shown in FIG. 1(e). The AlCu layer 23, the TiW layer 22, and oxide layer 20 is then etched, as shown in FIG. 1(f), to form holes 26' for the contact posts formed in the next step. The holes 26' extend to a depth sufficient to reach the regions to be contacted, such as the source and drain regions 14 and 15 of the buried MOS transistor 12.

Figure 1G:
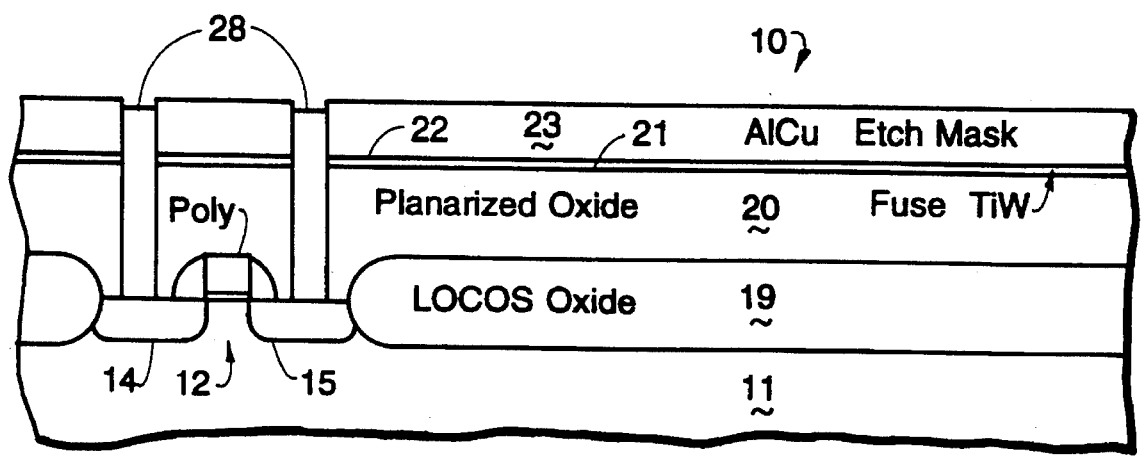

The photoresist layer 25 is then removed, and a TiW sticky layer and non-selective CVD tungsten are deposited to fill the holes 26' forming the contact posts 28 (FIG. 1(g)) to the source and drain regions 14 and 15 of the MOS transistor 12. The tungsten that forms the contact posts 28 is then planarized, using an REB (resistive etch back) or similar process, using the AlCu for etch stop.

Figure 1H:
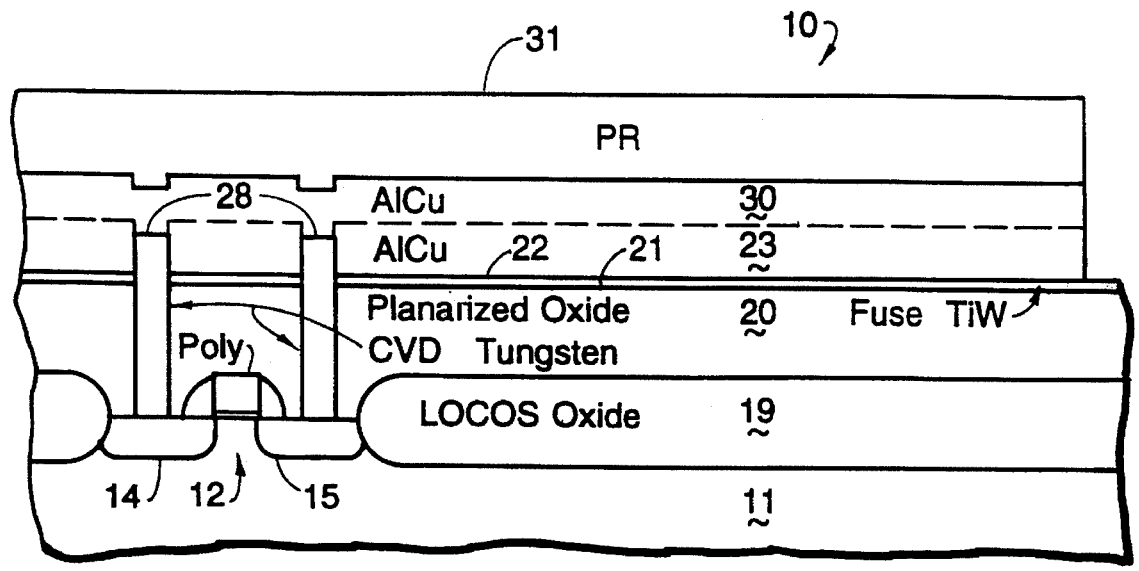
Figure 1I:
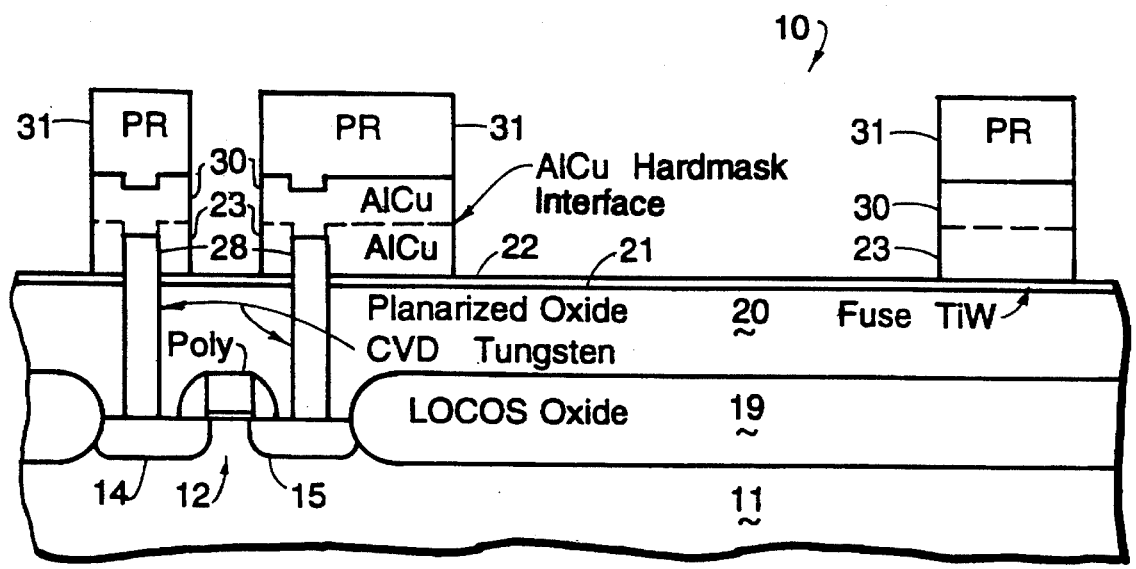

As shown in FIG. 1(h), an additional overall layer 30 of AlCu is deposited to facilitate subsequent lead formation, and a layer of photoresist 31 is deposited thereover. The second layer 30 of AlCu can be of such thickness to enable contacts and leads of desired thickness to be formed, when combined with the thickness of the first AlCu layer 23. For example, a thickness of between about 2000 Å and 3000 Å may be used, if desired. To form the leads, the photoresist layer is patterned and both layers 30 and 23 of the AlCu are etched, stopping on the TiW layer 21, as shown in FIG. 1(i). At this point, it will be noticed that the dual layers 30 and 23 form leads to the tungsten posts 28 for connection to the source and drain regions 14 and 15 of the MOS transistor 12.

Figure 1J:
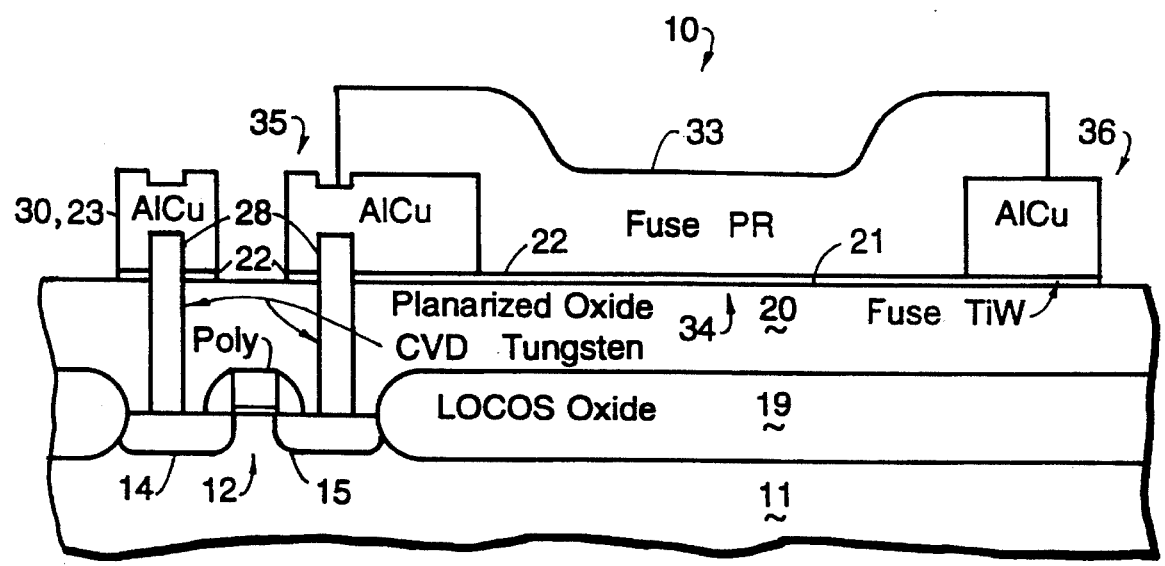

The photoresist layer 31 is then removed, and another photoresist layer 33 is deposited and patterned, as shown in FIG. 1(j). The TiW fuse material 22 is then etched and removed, using the AlCu as a mask for lead pattern during TiW etch, leaving only a portion 34 of the fuse material between contact elements 35 and 36 for access. If desired, the lead photoresist layer 31 can be removed, or alternatively, can be left in place, depending upon the particular application or circuit needs.

It will be appreciated that the process adds only a single mask to the normal process flow, and does not necessarily require premetal planarization. A similar approach can be used, of course, on additional metal levels, if desired.

Figure 2A:
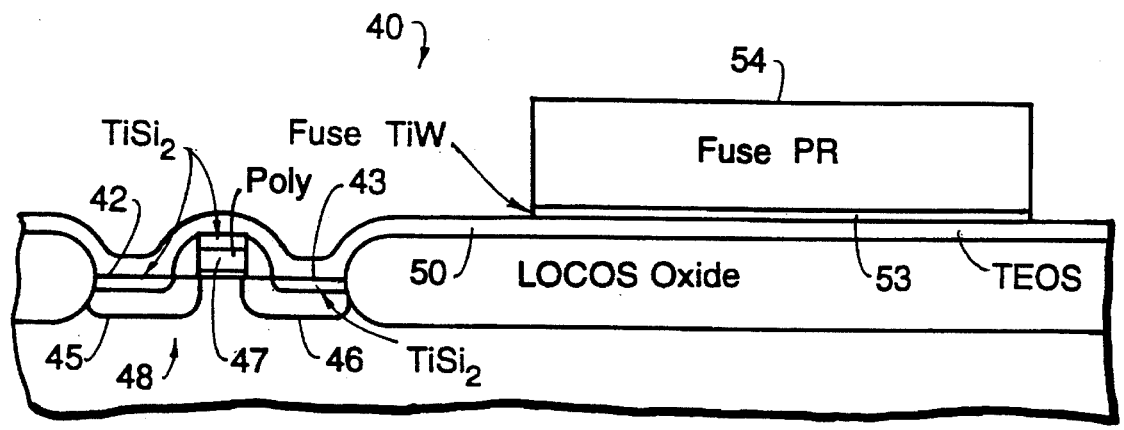
FIGS. 2(a) and 2(b) are a series of cross-sectional side views of a integrated circuit during various states of fabrication of a TiW fuse, in accordance with an alternative preferred method according to the invention. In the various figures of the drawings, like reference numerals are used to denote like or similar parts.
Figure 2B:
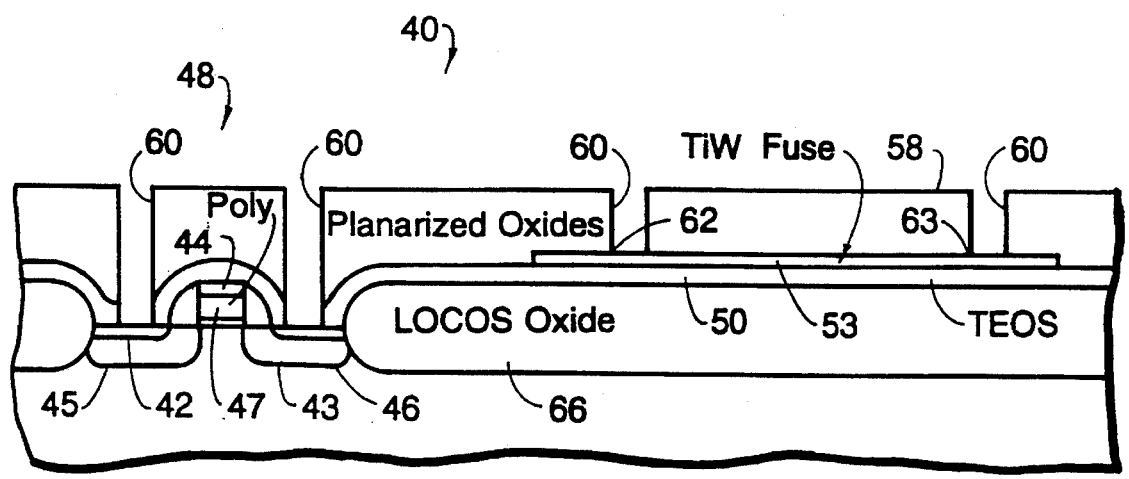

A portion of a process flow for forming an integrated circuit 40 having one or more TiW fuse elements that may be spaced laterally from a MOS device 48, in accordance with another embodiment of the invention, is illustrated in FIGS. 2(a)–2(b). The TiW fuse formation may be begun in the stage of a normal BiCMOS integrated circuit process at the point at which titanium silicide ($TiSi_2$) contact regions 42, 43, and 44 are formed on the respective source 45, drain 46, and gate 47 regions of the MOS devices 48, and a layer 50 of tetra-ethyl-ortho-silicate (TEOS) is deposited overall. The TEOS layer 50 may typically be, for example, about 1000 Å thick.

The normal process is then modified by the deposition of a layer 53 of TiW fuse material overall, for instance of about 500 Å thickness. A layer 54 of photoresist is formed over the TiW layer 53, and the TiW layer 53 is then patterned using photoresist patterning and subsequent etching techniques to produce the intermediate structure shown in FIG. 2(a). Thus, a photoresist layer 54 is formed on the fuse layer 53, is exposed to an exposing source, such as light, e-beam, or the like to defining a mask to delimit regions of said fuse layer for removal. Subsequently, portions of said fuse layer are removed by etching, or the like, in the regions defined by said mask. The remaining portion of the layer 53, as shown, will constitute the fuse element in the final circuit. The photoresist layer 54 may then be removed.

The intermediate structure of FIG. 2(a) may then be further processed, in a manner similar to that described above with reference to FIG. 1(f) by depositing and planarizing (if desired) a layer of CVD oxide 58 directly over the structure and forming contact holes 60 at desired locations to produce the structure shown in FIG. 2(b). In the structure of FIG. 2(b), the contact holes 60 are located, for example over the source 45 and drain 46 regions of the MOS device 48, and at end locations 62 and 63 of the fuse. It will be noted, however, that in the formation of the fuse in the embodiment of FIG. 2, the AlCu etch mask is not employed, in contrast to the method and structure of FIG. 1, since the TiW fuse is formed initially by a photoresist mask.

The final structure (not shown), is then completed in a similar manner as described above with reference to FIG. 1(g)–1(j), for example, by filling the contact holes 60 with conductor material, and forming contact structures and leads to the contact materials. The structure may then be completed by depositing a layer of phospho-silicate-glass (PSG), CVD oxide, and premetal planarizing, if desired. All contacts are then patterned and etched, including the contacts to the TiW fuse. The structure may then be processed through metalization as normal.

It should be noted that the selectivity of oxide 58 over the TiW layer 53 is easily attainable. Even if the contact etch does etch through the fuse layer 53, it will only etch into the LOCOS oxide 66. Moreover, the process described may be used for 2nd, 3rd, or subsequent level metal fuses, without requiring premetal planarization.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A method for providing programmable devices in which an insulation layer is formed during a BiCMOS integrated circuit fabrication process, comprising: forming a first conductor fuse layer on said insulation layer;

forming a second conductor contact layer on said fuse layer;

forming contact holes in said fuse, contact layer, and insulation layer to regions to which contact is desired under said insulation layer;

forming contact conductors in said contact holes in electrical contact with said fuse, contact layers, and regions under said insulation layer;

removing portions of said contact layer to leave contact leads in electrical contact with said fuse layer and at least some of said contact conductors;

and removing portions of said fuse layer to leave fuse material in regions between selected contact leads at which fuses are desired.

2. The method of claim 1 further comprising forming a third conductor contact layer on said second conductor contact layer before removing portions of said second conductor contact layer, and removing portions of said third conductor contact layer in the same step as removing said second conductor contact layer.

3. The method of claim 1 wherein said insulation layer is an oxide layer.

4. The method of claim 1 wherein said step of forming a first conductor fuse layer on said insulation layer comprises forming a TiW layer on said insulation layer.

5. The method of claim 1 wherein said step of removing portions of said fuse layer to leave fuse material in regions between selected contact leads at which fuses are desired comprises forming a photoresist layer on said contact leads, processing said photoresist layer to form a lead mask defining regions of said fuse layer for removal, and removing portions of said lead layer in the regions defined by said lead mask.

6. The method of claim 5 further comprising allowing said lead mask to remain in place during subsequent processing steps.

7. The method of claim 1 wherein said step of forming a second conductor contact layer on said fuse layer comprises forming a AlCu layer on said fuse layer.

8. The method of claim 1 wherein said step of forming contact conductors in said contact holes in electrical contact with said fuse and contact layers comprises forming tungsten in said contact holes.

9. A method for making a fuse on an integrated circuit having a device for contact with the fuse, and with a planarized dielectric layer overlying the device, comprising:

forming a layer of fuse material on a surface of the planarized dielectric layer;

forming a first conductive lead layer over at least the layer of fuse material;

forming conductive contact posts through the dielectric layer, the layer of fuse material, and the conductive lead layer to contact the device;

forming a second conductive lead layer over the first conductive lead layer;

forming a lead mask on said second conductive lead layer over an area in which leads are desired;

patterning the first and second conductive lead layers to form a lead and contact pattern to contact selected contact posts and selected regions of said fuse material, and to expose said layer of fuse material aside said contact posts;

forming a fuse mask on said fuse material over an area in which the fuse is desired, leaving other areas unmasked;

and removing said fuse material in said unmasked areas.

10. The method of claim 9 wherein said step of removing said fuse material in said unmasked areas comprises etching said fuse material in said unmasked regions.

11. The method of claim 10 wherein said step of etching said fuse material in said unmasked areas further comprises using an etch mask for the lead pattern as an etch stop.

12. The method of claim 9 further comprising allowing said lead mask to remain during subsequent processing steps.

13. The method of claim 9 wherein said step of forming a layer of fuse material on a surface of the planarized dielectric layer comprises forming a layer of TiW on the planarized dielectric layer.

14. The method of claim 13 wherein said step of forming a layer of TiW comprises forming a layer of TiW of thickness of approximately 500 Å.

15. The method of claim 9 wherein said steps of forming first and second conductive layer comprises forming a layers of AlCu.

16. The method of claim 15 wherein said step of forming a first layer of AlCu comprises forming a layer of AlCu having a thickness between about 2000 Å and 3000 Å.

17. The method of claim 16 wherein said step of forming a second conductive lead layer over the first conductive lead layer comprises forming a layer of AlCu having a thickness between about 2000 Å and 3000 Å.

18. The method of claim 9 further comprising planarizing the contact posts prior to forming the second conductive lead layer using the first conductive lead layer as an etch stop.

19. The method of claim 9 wherein said steps of forming conductive contact posts comprises depositing a TiW sticky layer and non-selective CVD tungsten into holes through the dielectric layer, the layer of fuse material, and the conductive lead layer.

20. A method for forming a fuse in a BiCMOS integrated circuit fabrication process, comprising:

forming and patterning an electrically conducting fuse layer on a first insulation layer over a partially completed integrated circuit structure;

forming a second insulation layer over at least a portion of said fuse layer;

forming at least one contact hole in at least said second insulation layer that extends to at least one region to which contact is desired under said second insulation layer, including at least one end of the fuse layer;

forming a contact conductor in said contact hole in electrical contact with said region to which contact is desired; and forming contacts to said contact conductor above said second insulation layer.

21. The method of claim 20 wherein said step of forming said fuse layer on a first insulation layer comprises forming said fuse layer on a TEOS layer.

22. The method of claim 20 wherein said step of forming an electrically conductor fuse layer on said first insulation layer comprises forming a TiW layer on said first insulation layer.

23. The method of claim 20 wherein said step of patterning said fuse layer comprises forming a photoresist layer on said fuse layer, processing said photoresist layer to form a mask defining regions of said fuse layer for removal, and removing portions of said fuse layer in the regions defined by said mask.

24. The method of claim 20 wherein said step of forming a second insulation layer comprises forming an oxide layer on said fuse layer.

25. The method of claim 20 wherein said step of forming a contact conductor in said contact hole in electrical contact with said fuse and contact regions comprises forming tungsten in said contact holes.

* * * * *